United States Patent
Belot

(10) Patent No.: US 7,224,229 B2
(45) Date of Patent: May 29, 2007

(54) ELECTRONIC SIGNAL AMPLIFIER AND METHOD AND ARTICLE FOR DETERMINING THE GAIN OF SUCH AN AMPLIFIER

(75) Inventor: Didier Belot, Rives (FR)

(73) Assignee: STMicroelectronics AS, Montrouge (FR)

( * ) Notice: Subject to any disclaimer, the term of this patent is extended or adjusted under 35 U.S.C. 154(b) by 61 days.

(21) Appl. No.: 11/047,475

(22) Filed: Jan. 31, 2005

(65) Prior Publication Data

US 2005/0189994 A1 Sep. 1, 2005

(30) Foreign Application Priority Data

Feb. 3, 2004 (FR) .................................. 04 01016

(51) Int. Cl.
*H03F 3/60* (2006.01)
(52) U.S. Cl. ........................................ 330/286; 330/295
(58) Field of Classification Search ............... 330/286, 330/295, 54, 124 R, 84, 126
See application file for complete search history.

(56) References Cited

U.S. PATENT DOCUMENTS 6,433,640 B1 * 8/2002 Pavio et al. ................. 330/295

6,674,329 B1 * 1/2004 Stengel et al. .............. 330/286

FOREIGN PATENT DOCUMENTS

WO   WO 02/103910 A2   12/2002

OTHER PUBLICATIONS

Ballweber, B., et al., "A Fully Integrated 0.5-5.5-GHz CMOS Distributed Amplifier," *IEEE Transactions on Solid-State Circuits* 35(2):231-238, Feb. 2000.
Lee, G-A., et al., "Advanced Design of Broadband Distributed Amplifier using a SiGe BiCMOS Technology," in Proceedings of the 2003 IEEE MTT-S International Microwave Symposium Digest, Philadelphia, Jun. 8-13, 2003, pp. A189-A192.

* cited by examiner

*Primary Examiner*—Henry Choe
(74) *Attorney, Agent, or Firm*—Lisa K. Jorgenson; Timothy L. Boller; Seed IP Law Group PLLC

(57) ABSTRACT

An embodiment of an electronic signal amplifier comprises a power source, an input inductor, an output inductor and one or more branches connected in parallel between the terminals of the power source. Each branch comprises a transistor having a control electrode connected to an intermediate terminal of the input inductor, a first main electrode connected to a first terminal of the power source, and a second main electrode connected to a second terminal of the power source via a capacitor. The second main electrode of each transistor of a branch is also connected to an intermediate terminal of the output inductor.

20 Claims, 5 Drawing Sheets

ELECTRONIC SIGNAL AMPLIFIER AND METHOD AND ARTICLE FOR DETERMINING THE GAIN OF SUCH AN AMPLIFIER

BACKGROUND OF THE INVENTION

1. Field of the Invention

The present disclosure relates to an electronic signal amplifier. It also relates to an article for determining the gain of such an amplifier.

2. Description of the Related Art

An amplifier corresponding to the circuit diagram in FIG. 1 is known to those skilled in the art. Such an amplifier comprises a given number N of quadrupolar amplification cells referenced C1, C2, ..., CN connected in series, where N is an integer greater than or equal to unity. By reason of this structure, the amplifier is classed as a "distributed amplifier". It additionally comprises a power source 10 having a ground node or terminal 3 and a positive supply node or terminal 4.

The cell C1 comprises a capacitor 11 of capacitance $\Gamma_1$, a transistor 12, for example of the n-MOS type, and two inductors 13 and 14 of respective values $L_{13}$ and $L_{14}$. The source of the transistor 12 is connected to the terminal 3, and the drain of the transistor 12 is connected to the terminal 4 via the capacitor 11. The gate of the transistor 12 is connected to a first output of the cell C1 and is connected to a first input of the cell C1 via the inductor 13. The drain of the transistor 12 is connected to a second input of the cell C1 via the inductor 14 and is connected to a second output of the cell C1.

All the amplification cells have structures identical to that of the cell C1. Thus, the cell Cn comprises a capacitor n1 of capacitance $\Gamma_n$, a transistor n2 and two inductors n3 and n4 of respective values $L_{n3}$ and $L_{n4}$, n being an integer between 1 and N. The capacitors 11, 21, ..., N1 may be identical to each other, as may the transistors 12, 22, ..., N2. Each transistor 12, 22, ..., N2 has an internal capacitance $\Gamma_{e1}$, $\Gamma_{e2}$, ..., $\Gamma_{eN}$ between the gate and the source of this transistor. The inductors 13, 23, ..., N3 may also be identical to each other, as may the inductors 14, 24, ..., N4.

The amplification cell Cn, for n in the range 2 to N−1 (n=2, ..., N−1), is connected in the following manner to the cells Cn−1 and Cn+1: the first and second inputs of the cell Cn are connected to the first and second outputs of the cell Cn−1, respectively, and the first and second outputs of the cell Cn are connected to the first and second inputs of the cell Cn+1, respectively.

The first input of the cell C1 forms an input 1i of the amplifier: it receives an input electronic signal "IN". The second input of the cell C1 is connected to the terminal 3 via a resistor 5. The first output of the last cell CN is connected to the terminal 3 via an inductor referenced (N+1)3 in series with a 6. Finally, the second output of the cell CN is connected to an output 2o of the amplifier via an inductor (N+1)4. It delivers the amplified signal which forms the amplifier output signal "OUT".

In addition, the input of the amplifier is positively biased in a known fashion.

The voltage gain $A_v$ of such an amplifier can be calculated in the following manner.

A first imaginary delay line is initially defined that is formed by the inductors 13, 23, ... N3, (N+1)3 connected in series one after the other, and by the capacitors associated with the internal capacitances of the transistors 12, 22, ..., N2, connected, at one end, to nodes between the inductors 13, 23, ..., N3, (N+1)3 and, at the other end, to the terminal 3. This first delay line is called the input delay line of the amplifier. The attenuation introduced by the input delay line is denoted $A_e$, and a characteristic impedance $Z_e$ of the input delay line is given by the equation:

$$Z_e = \sqrt{\frac{\sum_{n=1}^{N} L_{n3}}{\sum_{n=1}^{N} \Gamma_{en}}} \quad (1)$$

In the same way, a second imaginary delay line, referred to as the output delay line of the amplifier, is defined. The output delay line comprises the inductors 14, 24, ..., N4, (N+1)4, connected in series one after the other, and the capacitors 11, 21, ..., N1, connected, at one end, to nodes between the inductors 14, 24, ..., N4, (N+1)4 and, at the other end, to the terminal 4. The attenuation introduced by the output delay line is denoted $A_s$, and a characteristic impedance $Z_s$ of the output delay line is given by the equation:

$$Z_s = \sqrt{\frac{\sum_{n=1}^{N} L_{n4}}{\sum_{n=1}^{N} \Gamma_n}} \quad (2)$$

The voltage gain $A_v$ of the amplifier is then given by the equation:

$$A_v = g_m^2 \times \frac{Z_e \exp(-NA_e) \times_s \exp(-NA_s)}{4(A_e - A_s)^2} \quad (3)$$

where $g_m$ denotes the transfer coefficient of the transistors 12, 22, ..., N2 at the biasing point of the latter. In other words, $g_m$ is the ratio of a variation in the current flowing between the drain and the source of each transistor 12, 22, ..., N2 to a variation in the electrical potential on the gate of this transistor.

An amplifier according to FIG. 1 has a low electrical power consumption since it comprises neither feedback loops nor resistors between the terminals 3 and 4. Moreover, it exhibits a very wide bandwidth, compatible with a high data rate content in the amplified signal. This rate can reach 10 GHz. For this reason, such an amplifier is commonly referred to as a UWB (Ultra Wide Band) amplifier.

Such a UWB amplifier comprises 2×(N+1) inductors. In order to obtain an amplifier with a high output current capability, there must be a sufficiently large number of amplification cells N. Usually, N is equal to at least 3, implying that the amplifier comprises at least 8 inductors which leads to a high cost of production for the amplifier.

BRIEF SUMMARY OF THE INVENTION

One embodiment of the present invention provides a UWB amplifier with a reduced cost of production.

In one aspect, an embodiment of the invention proposes an electronic signal amplifier which comprises:

a power source having a first and a second terminal;

an input inductor and an output inductor each having a first and a second end terminal and a given number N of intermediate terminals, where N is an integer greater then or equal to unity, said first end terminal of the input inductor and said second end terminal of the output inductor being respectively connected to an input and to an output of said amplifier, said second end terminal of the input inductor and said first end terminal of the output inductor being connected to said first terminal of the power source, respectively; and N branches connected in parallel between said first and second terminals of the power source, each branch comprising:

a capacitor, and a transistor having a control electrode connected to a respective intermediate terminal of the input inductor, a first main electrode connected to said first terminal of the power source, and a second main electrode connected to said second terminal of the power source via said capacitor of said branch, said second main electrode of said transistor being additionally connected to an intermediate terminal of the output inductor, an internal capacitance existing between the control electrode and said first main electrode of said transistor.

In an amplifier according to one embodiment of the invention, the control electrodes of the respective transistors of the amplifier branches are connected to the first terminal of the power source via respective portions of the input inductor. Each of these portions is included between an intermediate terminal of the input inductor and the second end terminal of the input inductor. The control electrodes of the transistors are additionally connected to the input of the amplifier via respective portions of the input inductor complementary to said portions of the input inductor.

Similarly, the second main electrodes of the transistors of the various branches of the amplifier are connected to the first terminal of the power source via respective portions of the output inductor. Each of these portions is included between a respective intermediate terminal of the output inductor and the first end terminal of the output inductor. The second main electrodes of the transistors are additionally connected to the output of the amplifier via respective portions of the output inductor complementary to said portions of the output inductor.

An amplifier according to an embodiment of the invention therefore comprises two inductors. Thanks to this reduction in the number of inductors, the total cost of the amplifier is reduced.

In addition, the amplifier is of the UWB type in the sense that it exhibits a very wide bandwidth.

One advantage of an embodiment of an amplifier according to the invention resides in the noise level of the amplified signal. This noise level is especially low, thanks to the decrease in antenna effect associated with the reduction in the number of inductors in the amplifier.

According to a another embodiment of an amplifier according to the invention, at least one of the input and output inductors is produced in the form of a metal trace within an electronic integrated circuit comprising at least a part of said amplifier. Thanks to the reduction in the number of inductors in the amplifier, that part of the surface area of the integrated circuit which is occupied by these inductors is reduced. An amplifier according to one embodiment of the invention is consequently compatible with an especially high level of integration.

In one aspect, two different intermediate terminals of the input inductor or of the output inductor may be separated by a portion of the trace of said inductor comprising at least one turn.

Since the control electrodes of the transistors of the amplifier branches are connected respectively to the intermediate terminals of the input inductor according to a first order of said intermediate terminals along the trace of said input inductor, and since the second main electrodes of the transistors of the amplifier branches are connected respectively to the intermediate terminals of the output inductor according to a second order of said intermediate terminals along the trace of said output inductor, said first order is advantageously identical to, or the inverse of, said second order. A small distortion is then introduced by the amplifier into the amplified signal generated at the output of the amplifier with respect to the signal to be amplified applied to the input.

In another aspect, the gain of an amplifier such as that described above is determined using a method comprising the following steps:

self-inductance coefficients are determined for successive portions of the input inductor, respectively between the first end terminal and a first intermediate terminal of said input inductor, between successive intermediate terminals of said input inductor, and between a last intermediate terminal and the second end terminal of said input inductor;

mutual inductance coefficients are determined between the successive portions of said input inductor;

a characteristic input impedance is calculated in the form of a square root of a quotient of a difference between a first sum of the self-inductance coefficients of said input inductor and a second sum of the mutual inductance coefficients of said input inductor, over a third sum of the internal capacitances of the transistors of the amplifier branches;

self-inductance coefficients are determined for successive portions of the output inductor, respectively between the first end terminal and a first intermediate terminal of said output inductor, between successive intermediate terminals of said output inductor, and between a last intermediate terminal and the second end terminal of said output inductor;

mutual inductance coefficients are determined between the successive portions of said output inductor;

a characteristic output impedance is calculated in the form of a square root of a quotient of a difference between a fourth sum of the self-inductance coefficients of said output inductor and a fifth sum of the mutual inductance coefficients of said output inductor, over a sixth sum of the capacitances of said capacitors of the amplifier branches;

an input attenuation $A_e$ and an output attenuation $A_s$, corresponding respectively to a first and a second delay line, are determined, the first delay line comprising first elementary inductors associated with the self-inductance coefficients of the portions of the input inductor and connected in series one after another, and comprising capacitors associated with the internal capacitances of the transistors of the amplifier branches and connected, at one end, to respective nodes between said first elementary inductors and, at the other end, to a first common terminal, and the second delay line comprising second elementary inductors associated with the self-inductance coefficients of the portions of the output inductor and connected in series one after another, and comprising said capacitors of the amplifier branches connected at one end to respective nodes between said second elementary inductors and at the other end to a second common terminal; and the gain of the amplifier is calculated in the form of a quotient between a first and a second product, said first product comprising at least the characteristic input impedance, the characteristic output impedance, a first term of the form $\exp(-N.A_e)$ and a second term of the form $\exp(-N.A_s)$, exp denoting the exponential operation, said second product comprising at least the square of a difference between the input and the output attenuations.

A gain thus determined may be used, for example, for simulating numerically the operation of an electrical device comprising an amplifier such as that considered in the invention. It can also be used to determine the electrical or geometrical characteristics of such an amplifier as a function of a given gain value.

Another aspect of an embodiment of the invention is a computer readable media containing instructions for a causing a processor to calculate an amplifier gain employing such a calculation method.

In another aspect, an electronic signal amplifier comprises: a power source having a first and a second terminal; an input inductor and an output inductor each having a first and a second end terminal and a given number N of intermediate terminals, where N is an integer greater than or equal to unity, said first end terminal of the input inductor and said second end terminal of the output inductor being respectively connected to an input and to an output of said amplifier, and said second end terminal of the input inductor and said first end terminal of the output inductor being connected to said first terminal of the power source; and N branches connected in parallel between said first and second terminals of the power source, each branch comprising: a capacitor; and a transistor having a control electrode connected to a respective intermediate terminal of the input inductor, a first main electrode connected to said first terminal of the power source, and a second main electrode connected to said second terminal of the power source via said capacitor of said branch, said second main electrode of said transistor being additionally connected to an intermediate terminal of the output inductor, an internal capacitance existing between the control electrode and said first main electrode of said transistor.

In another aspect, a computer-readable media contains instructions for causing a processor to: sum self-inductance coefficients for successive portions of an input inductor of an amplifier; sum mutual-inductance coefficients for successive portions of the input inductor; sum respective transistor capacitances of a plurality of amplification branches of the amplifier; calculate a square root of a quotient of a difference between the sum of the self-inductance coefficients of the input inductor and the sum of the mutual-inductance coefficients of the input inductor divided by the sum of the internal transistor capacitances of the plurality of amplification branches of the amplifier, producing a characteristic input impedance of the amplifier; sum self-inductance coefficients for successive portions of an output inductor of an amplifier; sum mutual-inductance coefficients for successive portions of the output inductor; sum respective capacitor capacitances of the plurality of amplification branches of the amplifier; calculate a square root of a quotient of a difference between the sum of the self-inductance coefficients of the output inductor and the sum of the mutual-inductance coefficients of the output inductor divided by the sum of the internal capacitor capacitances of the plurality of amplification branches of the amplifier, producing a characteristic output impedance of the amplifier; calculate an input attenuation corresponding to a first delay line, the first delay line comprising first elementary inductors associated with the self-inductance coefficients of the portions of the input inductor connected in series and first delay line capacitors associated with the internal capacitances of the transistors of the plurality of amplification branches, wherein the first delay line capacitors are respectively connected at one end to a corresponding node between respective first elementary inductors and at another end to a first common terminal; calculate an output attenuation corresponding to a second delay line, the second delay line comprising second elementary inductors associated with the self-inductance coefficients of the portions of the output inductor connected in series and second delay line capacitors associated with the capacitances of the capacitors of the plurality of amplification branches, wherein the second delay line capacitors are respectively connected at one end to a corresponding node between respective second elementary inductors and at another end to a second common terminal; calculating a first product comprising at least the characteristic input impedance, the characteristic output impedance, a first term raised to an exponent of minus one multiplies by a number N multiplied by the input attenuation, a second term raised to an exponent of minus one multiplied by the number N multiplied by the output attenuation, wherein the number N corresponds to a number of amplification branches of the amplifier; calculate a second product comprising at least the square of a difference between the input attenuation and the output attenuation; and divide the first product by the second product, producing a gain of the amplifier.

In another aspect, a wide-band amplifier comprises: an input inductor electrically coupled between an input node and a first reference node and having a first intermediate input inductor node; an output inductor electrically coupled between the first reference node and an output node and having a first intermediate output inductor node; and a first amplification branch electrically coupled between the first intermediate input inductor node and the first intermediate output inductor node.

In another aspect, a wide-band amplifier comprises: an input inductor electrically coupled between an input node and a reference node and having a plurality of intermediate input inductor nodes; an output inductor electrically coupled between an output node and the reference node and having a plurality of intermediate output inductor nodes; and a plurality of amplification stages, each of the plurality of amplification stages electrically coupled between a respective intermediate input inductor node and a respective intermediate output inductor node.

In another aspect, a wide-band amplifier comprises: an input inductor coupled between an input node and a first reference node; an output inductor electrically coupled between an output node and the first reference node; a plurality of amplification stages; and means for electrically coupling the plurality of amplification stages between the input inductor and the output inductor.

In another aspect, a method of amplifying a signal comprises: applying the signal to a first end of an input inductor; coupling a reference voltage to a second end of the input inductor; coupling the reference voltage to a first end of an output inductor; and coupling an amplification stage between a first intermediate node of the input inductor and a first intermediate node of the output inductor.

BRIEF DESCRIPTION OF THE SEVERAL VIEWS OF THE DRAWINGS

Other features and advantages of the present invention will become apparent from the description of exemplary, non-limiting embodiments presented below with reference to the appended drawings, in which.

DETAILED DESCRIPTION OF THE INVENTION

Identical reference numbers used over several figures correspond to identical elements, or elements that have analogous functions, unless the context indicates otherwise.

Figure 2:
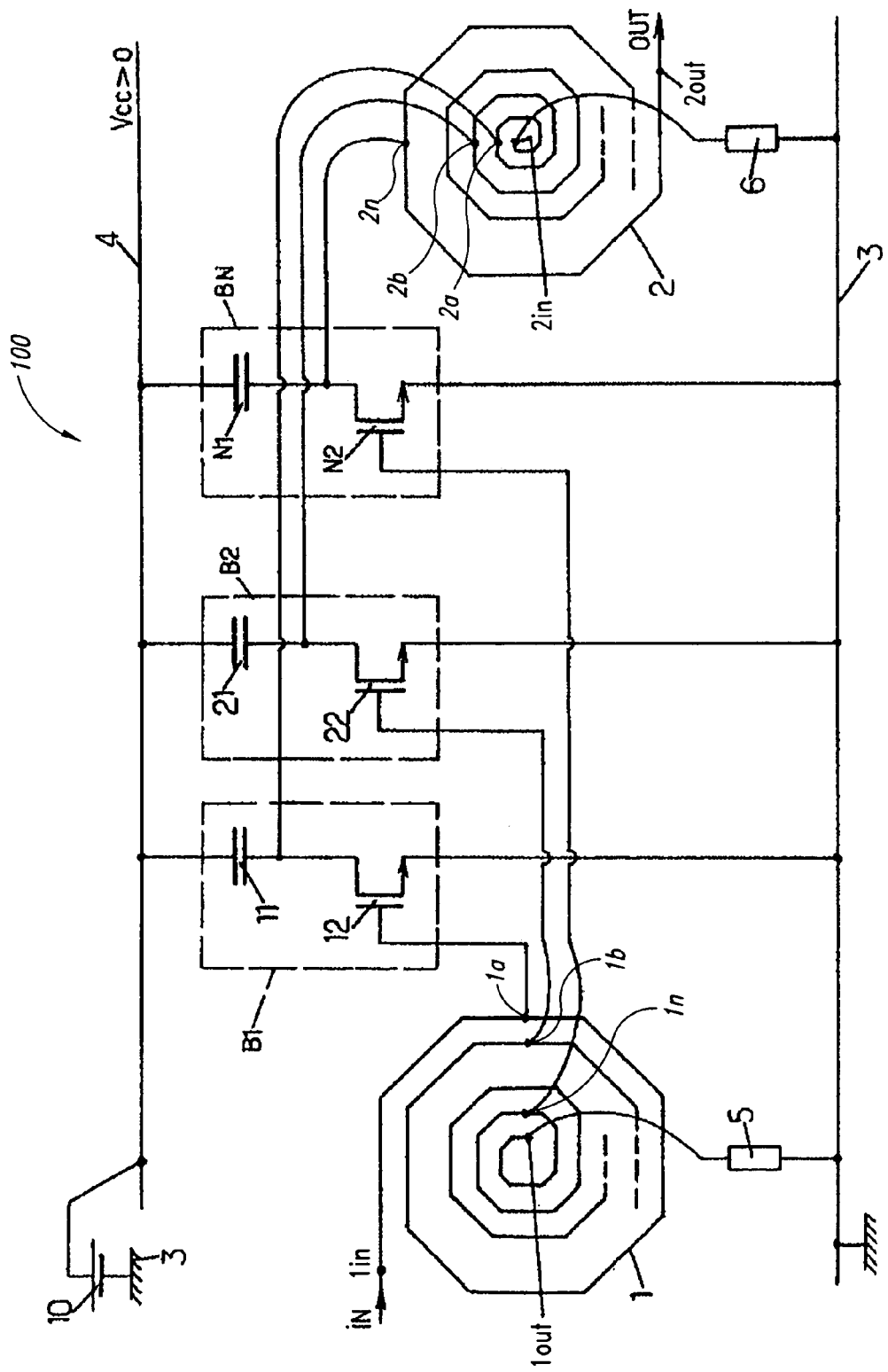
FIG. 2 is a circuit diagram of an amplifier according to an embodiment of the present invention.

According to the circuit diagram in FIG. 2, an electronic signal amplifier 100 comprises two inductors 1 and 2, designated respectively as input inductor and output inductor. Each of the inductors 1 and 2 can be formed by a plane, spiral-wound trace comprising (N+1) more or less concentric turns. Each inductor 1, 2 comprises two nodes or end terminals located respectively on the periphery and in the centre of the corresponding inductor trace, and N intermediate terminals located between the end terminals along the trace. The end terminal located on the periphery of the trace of the inductor 1 is the input node or terminal of the inductor 1; it has the reference 1in. The end terminal located in the centre of the trace of the inductor 1 is the output node or terminal of the inductor 1, with the reference 1out. The input terminal 2in and output terminal 2out of the inductor 2 are located in the centre and on the periphery of the trace of the inductor 2, respectively. In alternative embodiments, the input and output terminals of either one of the two inductors 1 and 2 may be interchanged with respect to their positions at the centre or at the periphery of the corresponding trace. Intermediate successive nodes or terminals of each inductor 1, 2 may be separated, for example, by one turn. As an example, N can be equal to three, with inductor 1 having three intermediate nodes 1a, 1b, 1N, and inductor 2 having three intermediate nodes 2a, 2b, 2N. The total self-inductance value of the inductor 1 can be, for example, 5 nH, and the total self-inductance value of the inductor 2 can be, for example, 20 nH.

The input terminal 1in of the inductor 1 receives the input signal to be amplified. This signal is denoted "IN" in FIG. 2. The output terminal 2out of the inductor 2 forms the output of the amplified signal, denoted "OUT". The output terminal 1out of the inductor 1 and the input terminal 2in of the inductor 2 are connected to a ground node or terminal 3 via the resistors 5 and 6, respectively. The resistors 5 and 6 can have the same value, for example 50 ohms.

A source of power 10 for the amplifier is connected between the ground terminal 3 and a supply node or terminal 4. The terminal 4 is thus held at a constant positive electrical potential $V_{CC}$. $V_{CC}$ can be equal to 5 volts, for example.

Amplification stages or branches B1, B2, . . . , BN are connected between the terminals 3 and 4 in parallel with each other. Each branch, denoted Bn, n=1, . . . , N, comprises a capacitor, with reference n1 in FIG. 2, having a capacitance $\Gamma_n$, and a transistor with reference n2. Preferably, the transistors 12, 22, . . . , N2 are of the field effect transistor (FET) type. They can be fabricated according to MOS (Metal-Oxide-Semiconductor) technology. All the capacitors 11, 21, . . . , n1 can be identical to each other. They can each have a capacitance equal, for example, to 50 pF. All the transistors 12, 22, . . . , N2 can also be identical to each other. For the amplifier described here, with $V_{CC}$ positive, the transistors 12, 22, . . . , N2 are of the n-MOS type. Each of the transistors 12, 22, . . . , N2 has an internal capacitance between the gate and the source of this transistor, denoted $\Gamma_{en}$. For example, this internal capacitance is of the order of 2 pF.

For each branch Bn, the source of the transistor n2 is connected to the terminal 3 and the drain of the transistor n2 is connected to the terminal 4 via the capacitor n1. The drain of the transistor n2 is also connected to one of the intermediate terminals of the inductor 2. The respective drains of the transistors 12, 22, . . . , N2, taken in this order, are respectively connected to one of the intermediate terminals of the inductor 2, taken successively starting from the first intermediate terminal 2a of the inductor 2 following the input terminal 2in. In addition, the respective gates of the transistors 12, 22, . . . , N2, taken in this order, are respectively connected to one of the intermediate terminals of the inductor 1, taken successively starting from the first intermediate terminal 1a of the inductor 1 following the input terminal 1in.

The gates and the drains of the transistors 12, 22, . . . , N2 are connected to the intermediate terminals of the inductor 1 and to the intermediate terminals of the inductor 2, respectively, following the same order of the intermediate terminals of each of the inductors 1 and 2, starting from the input terminal 1in or 2in of the corresponding inductor. Thus, the gate and the drain of the transistor 12, corresponding to the branch B1, are connected respectively to the first intermediate terminal 1a of the inductor 1 after the terminal 1in and to the first intermediate terminal 2a of the inductor 2 after the terminal 2in. In FIG. 2, these intermediate terminals correspond respectively to the most external turn of the inductor 1 and to the most internal turn of the inductor 2. Similarly, the intermediate terminals of the inductors 1 and 2 to which are connected the gate and the drain of the transistor N2, corresponding to the branch CN, correspond respectively to the innermost turn of the inductor 1 and to the outermost turn of the inductor 2. They are each located before the output terminal 1out or 2out of the corresponding inductor 1 or 2.

Figure 3:
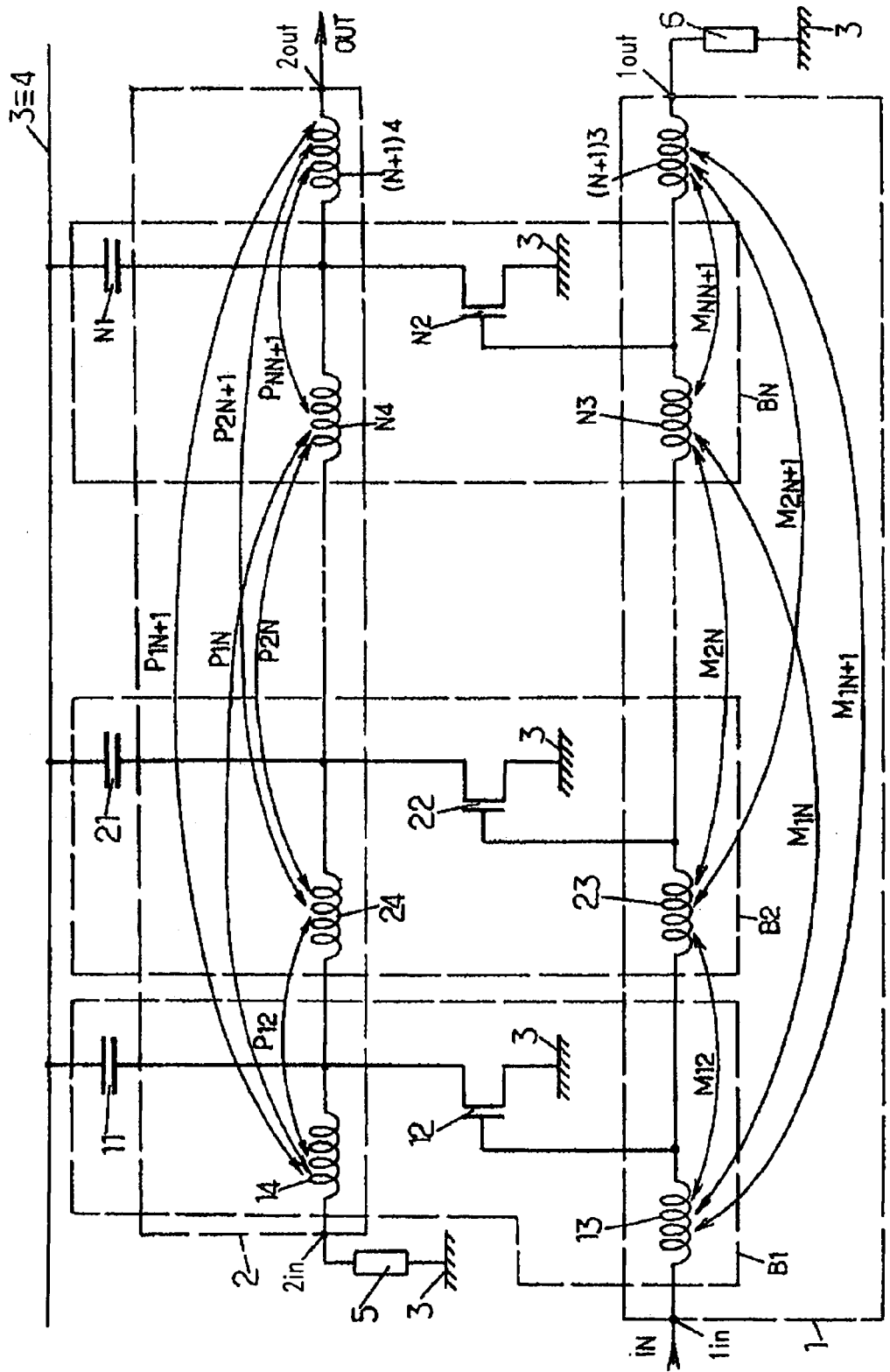
FIG. 3 is a circuit diagram equivalent to the circuit diagram in FIG. 2 for an AC component of the signal.

The operation of a circuit of the type of an amplifier according to the circuit diagram in FIG. 2 may be decomposed into a first circuit diagram relating to DC components of the electronic signals and into a second circuit diagram relating to an AC component of the electronic signals. The DC components correspond notably to the electrical supply for the amplifier and are commonly called biasing components. In particular, the input signal "IN" and output signal "OUT" each comprise a positive DC component in the case of the amplifier described here, superimposed on an AC component to be amplified. The description that follows will be limited to the AC components of the electronic signals. FIG. 3 is a circuit diagram equivalent to the circuit diagram in FIG. 2 for the AC components of the electronic signals.

Figure 1:
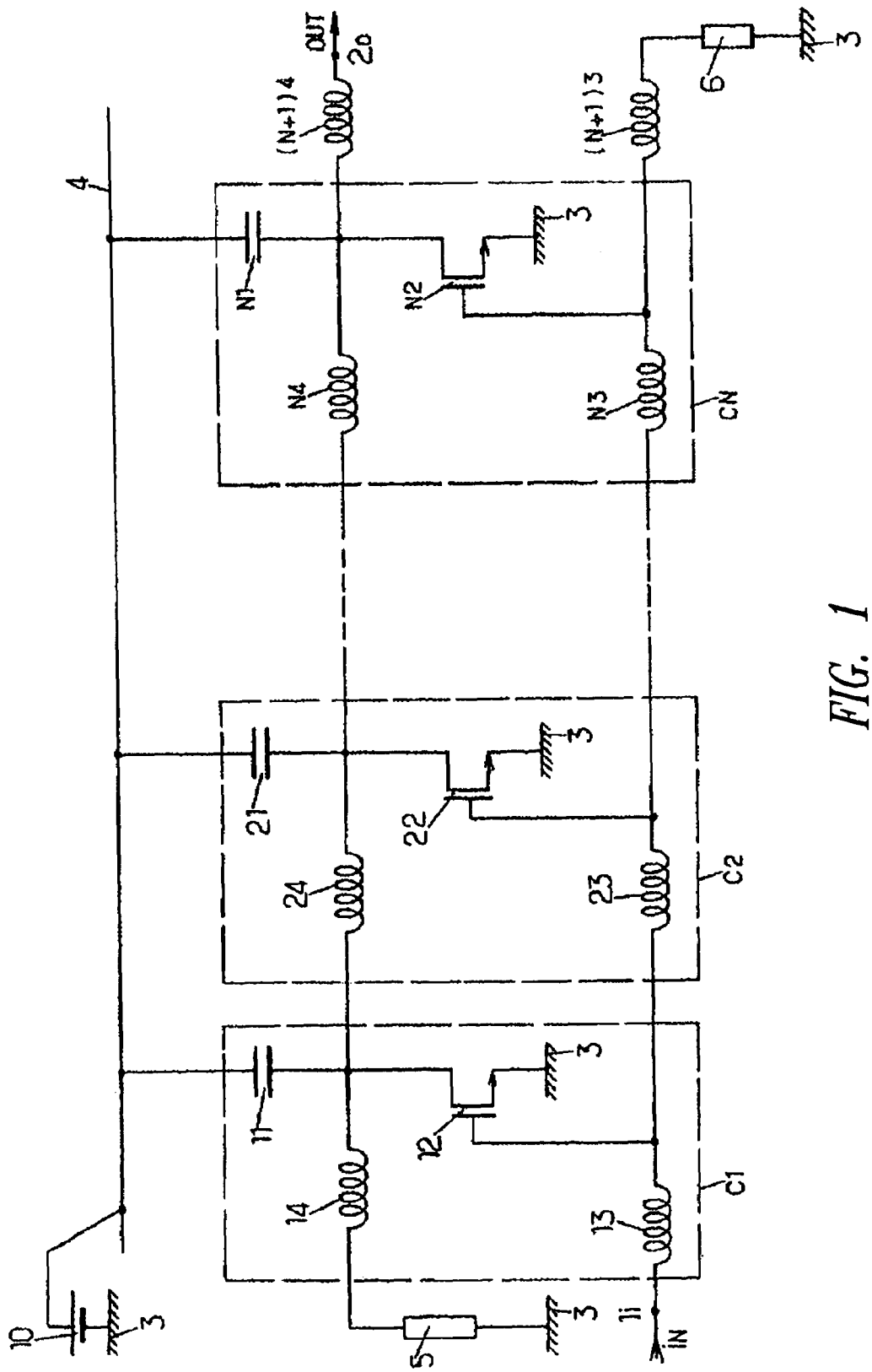
FIG. 1, already described, is a circuit diagram of an amplifier such as is known in the prior art.

According to the circuit diagram in FIG. 3, the inductor 1 is equivalent to a series of elementary inductors disposed respectively between the successive terminals of the inductor 1. By analogy with the circuit diagram in FIG. 1, these elementary inductors are referenced in the following manner: 13 for the elementary inductor equivalent to the portion of the inductor 1 situated between the input terminal 1in and the first intermediate terminal 1a of the inductor 1 following the terminal 1in along the trace of the inductor 1, n3 for the elementary inductor equivalent to the portion of the inductor 1 situated between the $(n-1)^{th}$ and $n^{th}$ intermediate terminals of the inductor 1 following the trace of the inductor 1 starting from the terminal 1in, for n=2, . . . , N, and (N+1)3 for the elementary inductor equivalent to the portion of the inductor 1 situated between the $N^{th}$ intermediate terminal of the inductor 1 and the output terminal 1out. Each elementary inductor n3, n=1, . . . , N+1, is characterized by a self-inductance coefficient $L_{n3}$ which can be determined or calculated from the configuration of the trace of the inductor 1.

The equivalent circuit diagram for the inductor 1 also comprises a series of couplings between the elementary inductors 13, 23, . . . , (N+1)3. The coupling between the elementary inductors i3 and j3, i=1, . . . , (N+1) and j=1, . . . , (N+1), with i≠j, is denoted $M_{ij}$. $M_{ij}$ is a mutual inductance coefficient. It can be measured or calculated from the configuration of the trace of the inductor 1. In the embodiment described here, $M_{ij}$ is equal to about 0.1 nH, for i≠j.

In the same way, the inductor 2 is equivalent to a series of elementary inductors disposed respectively between the successive terminals of the inductor 2. These elementary inductors are referenced in the following manner, again by analogy with FIG. 1: 14 for the elementary inductor equivalent to the portion of the inductor 2 situated between the terminal 2in and the first intermediate terminal of the inductor 2 following the terminal 2in along the trace of the inductor 2, n4 for the elementary inductor equivalent to the portion of the inductor 2 situated between the $(n-1)^{th}$ and $n^{th}$ intermediate terminals of the inductor 2 following the trace of the inductor 2 starting from the terminal 2in, for n=2, . . . , N, and (N+1)4 for the elementary inductor equivalent to the portion of the inductor 2 situated between the $N^{th}$ intermediate terminal of the inductor 2 and the output terminal 2out. Each elementary inductor n4, n=1, . . . , N+1, is characterized by a self-inductance coefficient $L_{n4}$.

The equivalent circuit diagram for the inductor 2 also comprises a series of couplings between the elementary inductors 14, 24, . . . , (N+1)4. The coupling between the elementary inductors i4 and j4, i=1, . . . , (N+1) and j=1, . . . , (N+1), with i≠j, is denoted by a mutual inductance coefficient $P_{ij}$. $P_{ij}$ can be measured or calculated in the same manner as $M_{ij}$: $P_{ij}$ is equal to about 0.4 nH, for i≠j.

It has been observed by the inventors that by defining a characteristic input impedance $Z_e$ and output impedance $Z_s$, for an amplifier according to the circuit diagram in FIG. 2, in the following manner:

$$Z_e = \sqrt{\frac{\sum_{n=1}^{N} L_{n3} - \sum_{i=1, j=1, i \neq j}^{i=N+1, j=N+1} M_{ij}}{\sum_{n=1}^{N} \Gamma_{en}}} \text{ and } Z_s = \sqrt{\frac{\sum_{n=1}^{N} L_{n4} - \sum_{i=1, j=1, i \neq j}^{i=N+1, j=N+1} P_{ij}}{\sum_{n=1}^{N} \Gamma_n}} \quad (4)$$

the relation (3) is still applicable for calculating the gain $A_v$ of an amplifier according to the circuit diagram in FIG. 2. The coefficient $A_e$ of the relation (3) is then the attenuation of a first imaginary delay line formed by the elementary inductors 13, 23, . . . , N3, (N+1)3 and by the capacitors associated with the internal capacitances of the transistors 12, 22, . . . , N2. This first delay line possesses the same structure as that described in relation to FIG. 1. The coefficient $A_s$ of the relation (3) is the attenuation of a second imaginary delay line formed by the elementary inductors 14, 24, . . . , N4, (N+1)4 and by the capacitors 11, 21, . . . , N1, connected in the same manner as that described in relation to FIG. 1. In the relation (3) applied to an amplifier according to FIG. 2, in view of the expressions for $Z_e$ and $Z_s$ given by the relations (4), $g_m$ is again the transfer coefficient of the transistors 12, 22, . . . , N2 at the biasing point of the latter.

Figure 4:
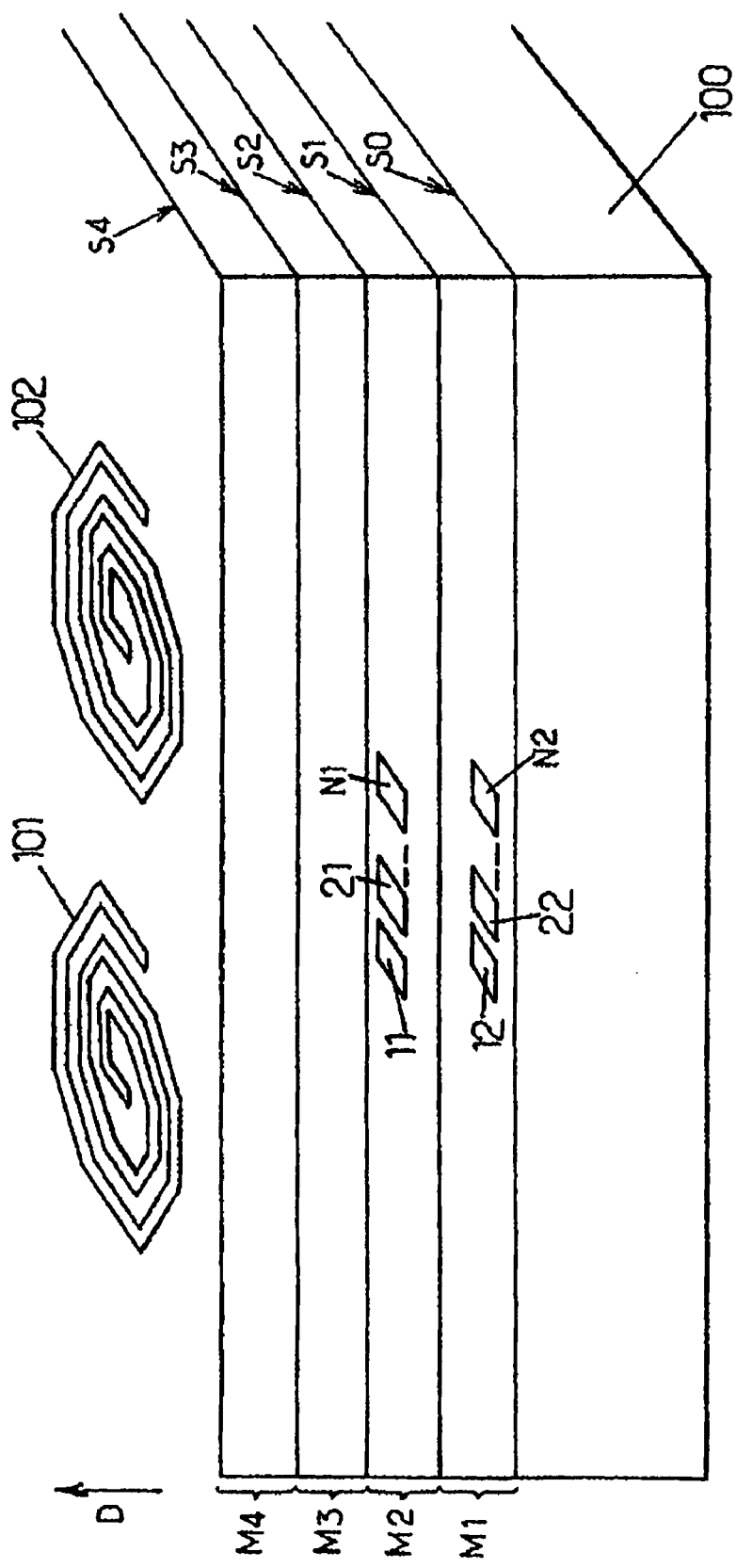
FIG. 4 illustrates a physical layout within an integrated circuit of an amplifier according to the circuit diagram in FIG. 2.

FIG. 4 illustrates an example of a physical layout within an electronic integrated circuit of an amplifier corresponding to the circuit diagram in FIG. 2. A substrate 100 made of a semiconductor, for example one based on doped silicon, has a substantially plane surface S0. D is a direction perpendicular to the surface S0, oriented away from the substrate 100. Several levels of metallization M1–M4 are stacked above the surface S0 in the D direction. These metallization levels may be produced, for example, using the damascene process known to those skilled in the art, or using its variant, the dual-damascene process. S1–S4 denote the respective top surfaces of the levels M1–M4.

The transistors 12, 22, . . . , N2 can be formed in the substrate 100, at the level of the surface S0. The capacitors 11, 21, . . . , N1 can be formed, for example, within the level M2. They are then disposed in the D direction, between the surfaces S1 and S2. The two inductors 1 and 2 can be disposed within the level M4. They are then situated between the surfaces S3 and S4. The metallization levels M1 and M3 can contain electrical interconnects (not shown here) connecting the capacitors 11, 21, . . . , N1, the transistors 12, 22, . . . , N2 and the inductors 1 and 2 according to the circuit diagram in FIG. 2. It should be pointed out that the representations of the transistors, capacitors and inductors in FIG. 4 are symbolic. In particular, they do not correspond to the actual dimensions of the components.

According to the physical layout described above, the transistors 12, 22, . . . , N2, the capacitors 11, 21, . . . , N1 and the inductors 1 and 2 are stacked above the same section of the surface S0: a particularly compact embodiment of an amplifier according to the invention is thus obtained. Such an embodiment reduces the real-estate requirements on the substrate 100. Moreover, its compactness reduces the noise level introduced by the amplifier into the amplified signal.

It is specified that the invention imposes no limitation on the type of inductors used in the detailed description above for the input inductor 1 and output inductor 2. Moreover, the disposition of the intermediate terminals along each of these inductors, between the end terminals, may be modified. Notably, the order of disposition of the intermediate terminals along the trace of one or both of the input inductor 1 or output inductor 2, between the input and output terminals of the corresponding inductor, may be inverted. Furthermore, the first and/or the last intermediate terminal of at least one of the inductors 1 and 2 can coincide with one of the end terminals of this inductor.

In certain embodiments of an amplifier according to the invention, additional electronic components may be included, without modifying the principle of the invention, which consists in using an input inductor and an output inductor that are common to several amplification branches.

It will be understood that transistors of the p-MOS type may be employed in place of the n-MOS transistors described above. A structure of an amplifier according to the invention using p-MOS transistors can be derived from the circuit diagram in FIG. 2, by applying transposition rules between opposite electrical biasing polarities. In particular, the electrical potential $V_{cc}$ must now be negative. The DC components of the "IN" and "OUT" signals are therefore also negative.

Lastly, it will be understood that an amplifier according to the invention can also be obtained by using transistors of the bipolar type. Replacing a transistor of the FET type with a transistor of the bipolar type can be effected by making use of the known correspondence rules between the two types of transistors.

Figure 5:
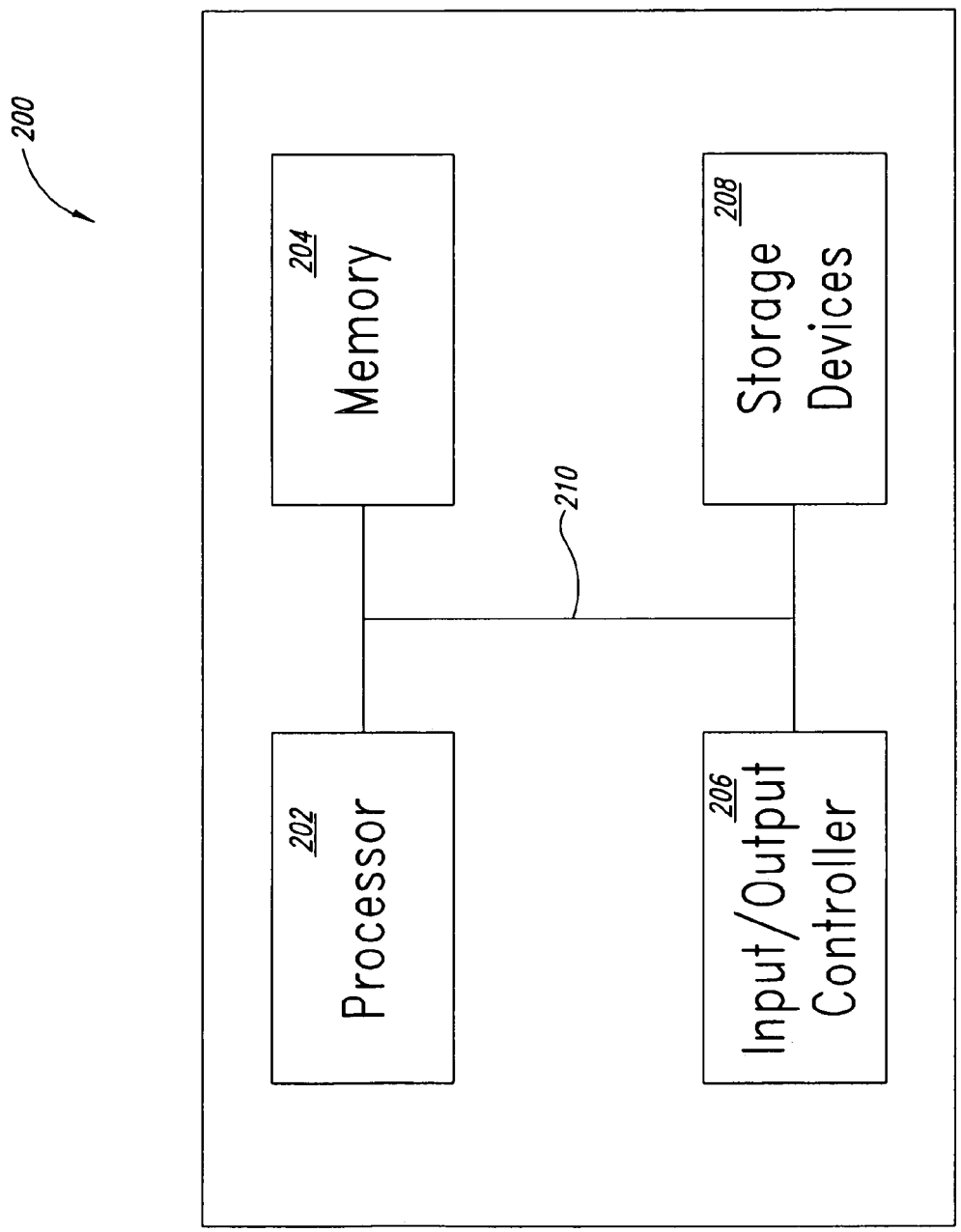
FIG. 5 illustrates a system for calculating a gain of an amplifier in accordance with one aspect of the invention.

FIG. 5 is a functional block diagram of an example system 200 comprising a processor 202 and a memory 204 for storing instructions for causing the processor 202 to determine a gain of an amplifier, such as the amplifier illustrated in FIG. 2 using the gain calculation method discussed above. The system 200 also comprises an input/output controller 206, and a storage device 208, such as a hard disk, an optical disk drive or a floppy drive. The system 200 also comprises a bus system 210, which may include a power bus, control bus, and status signal bus in addition to a data bus. For the sake of clarity, however, the various buses are illustrated in FIG. 5 as the bus system 210.

The term "computer-readable medium" as used herein refers to any medium that participates in providing instructions to a system or a processor for execution. Such a medium may take many forms, including but not limited to, non-volatile media, volatile media, and transmission media. Non-volatile media includes, for example, hard, optical or magnetic disks. Volatile media includes dynamic memory. Transmission media includes coaxial cables, copper wire and fiber optics. Transmission media can also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave, or any other medium from which a computer can read.

Various forms of computer readable media may be involved in carrying one or more sequences of one or more instructions to a processor for execution. For example, the instructions may initially be carried on a magnetic disk of a remote computer. The remote computer can load the instructions into its dynamic memory and send the instructions over a telephone line using a modem. A modem local to computer system can receive the data on the telephone line and use an infrared transmitter to convert the data to an infrared signal. An infrared detector coupled to a system bus can receive the data carried in the infrared signal and place the data on system bus. The system bus carries the data to system memory, from which a processor retrieves and executes the instructions. The instructions received by system memory may optionally be stored on storage device either before or after execution by the processor.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An electronic signal amplifier comprising:
a power source having a first and a second terminal;
an input inductor and an output inductor each having a first and a second end terminal and a given number N of intermediate terminals, where N is an integer greater than or equal to unity, said first end terminal of the input inductor and said second end terminal of the output inductor being respectively connected to an input and to an output of said amplifier, and said second end terminal of the input inductor and said first end terminal of the output inductor being connected to said first terminal of the power source; and
N branches connected in parallel between said first and second terminals of the power source, each branch comprising:
a capacitor; and
a transistor having a control electrode having a connection to a respective intermediate terminal of the input inductor, the connection to the intermediate terminal of the input inductor bypassing the end terminals of the input inductor, a first main electrode connected to said first terminal of the power source, and a second main electrode connected to said second terminal of the power source via said capacitor of said branch, said second main electrode of said transistor having a connection to an intermediate terminal of the output inductor, the connection to the intermediate terminal of the output inductor bypassing the end terminals of the output inductor, an internal capacitance existing between the control electrode and said first main electrode of said transistor.

2. The amplifier according to claim 1 wherein the control electrodes of the transistors of the branches are connected respectively to the intermediate terminals of the input inductor according to a first order of said intermediate terminals along a trace of said input inductor, and wherein the second main electrodes of the transistors of the branches are connected respectively to the intermediate terminals of the output inductor according to a second order of said intermediate terminals along a trace of said output inductor, said first order being identical to, or the inverse of, said second order.

3. The amplifier according to claim 1 wherein the transistors are of the field effect transistor type.

4. The amplifier according to claim 1 wherein at least one of the input and output inductors is produced in a form of a metal trace within an electronic integrated circuit comprising at least a part of said amplifier.

5. The amplifier according to claim 4 wherein two different intermediate terminals of the input inductor or of the output inductor are separated by a portion of the trace of said inductor comprising at least one turn.

6. A method for calculating the gain of an amplifier, comprising:
determining self-inductance coefficients for successive portions of an input inductor, respectively between a first end terminal and a first intermediate terminal of said input inductor, between successive intermediate terminals of said input inductor, and between a last intermediate terminal and a second end terminal of said input inductor;
determining mutual inductance coefficients between the successive portions of said input inductor;
calculating a characteristic input impedance in a form of a square root of a quotient of a difference between a first sum of the self-inductance coefficients of said input inductor and a second sum of the mutual inductance coefficients of said input inductor, over a third sum of internal capacitances of transistors of a plurality of amplifier branches;

determining self-inductance coefficients for successive portions of an output inductor, respectively between a first end terminal and a first intermediate terminal of said output inductor, between successive intermediate terminals of said output inductor, and between a last intermediate terminal and a second end terminal of said output inductor;

determining mutual inductance coefficients between the successive portions of said output inductor;

calculating a characteristic output impedance in a form of a square root of a quotient of a difference between a fourth sum of the self-inductance coefficients of said output inductor and a fifth sum of the mutual inductance coefficients of said output inductor, over a sixth sum of the capacitances of capacitors of the plurality of amplifier branches;

determining an input attenuation $A_e$ and an output attenuation $A_s$, corresponding respectively to a first and a second delay line; and calculating a gain of the amplifier in a form of a quotient between a first and a second product, said first product comprising at least the characteristic input impedance, the characteristic output impedance, a first term of the form $\exp(-N \cdot A_e)$ and a second term of a form $\exp(-N \cdot A_s)$, exp denoting the exponential operation, and said second product comprising at least a square of a difference between the input attenuation $A_e$ and the output attenuation $A_s$.

7. The method of claim 6 wherein the first delay line comprises:
first elementary inductors associated with the self-inductance coefficients of the portions of the input inductor and connected in series; and
a plurality of capacitors associated with internal capacitances of the transistors of the plurality of amplifier branches, connected at one end to respective nodes between said first elementary inductors and at another end to a first common node.

8. The method of claim 7 wherein the second delay line comprises:
second elementary inductors associated with the self-inductance coefficients of the portions of the output inductor connected in series; and
the plurality of capacitors of the amplifier branches connected at one end to respective nodes between the second elementary inductors and at another end to a second common node.

9. The method according to claim 6 wherein control electrodes of the transistors of the plurality of branches are connected respectively to intermediate terminals of the input inductor according to a first order of said intermediate terminals of the input inductor along a trace of said input inductor, and wherein second main electrodes of the transistors of the plurality of branches are connected respectively to intermediate terminals of the output inductor according to a second order of said intermediate terminals of the output inductor along a trace of said output inductor, said first order being identical to, or the inverse of, said second order.

10. The method according to claim 6 wherein at least one of the input and output inductors is produced in the form of a metal trace within an electronic integrated circuit comprising at least a part of said amplifier, and wherein two different intermediate terminals of the input inductor or of the output inductor are separated by a portion of the trace of said inductor comprising at least one turn.

11. A computer-readable media containing instructions for causing a processor to:
sum self-inductance coefficients for successive portions of an input inductor of an amplifier;
sum mutual-inductance coefficients for successive portions of the input inductor;
sum respective transistor capacitances of a plurality of amplification branches of the amplifier;
calculate a characteristic input impedance of the amplifier;
sum self-inductance coefficients for successive portions of an output inductor of an amplifier;
sum mutual-inductance coefficients for successive portions of the output inductor;
sum respective capacitor capacitances of the plurality of amplification branches of the amplifier;
calculate a characteristic output impedance of the amplifier;
calculate an input attenuation corresponding to a first delay line;
calculate an output attenuation corresponding to a second delay line;
calculate a first product comprising at least the characteristic input impedance, the characteristic output impedance, a first term raised to a first exponent, and a second term raised to a second exponent;
calculate a second product comprising at least a square of a difference between the input attenuation and the output attenuation; and
divide the first product by the second product, producing an estimated gain of the amplifier.

12. The computer-readable medial of claim 11 wherein the instructions cause the processor to calculate the characteristic input impedance of the amplifier by:
subtracting the sum of the mutual-inductance coefficients of the input inductor from the sum of the self-inductance coefficients of the input inductor, producing an input numerator;
dividing the input numerator by the sum of the respective transistor capacitances of the plurality of amplification branches of the amplifier, producing an input quotient; and
calculating the square root of the input quotient.

13. The computer-readable media of claim 11 wherein the instructions cause the processor to calculate the characteristic output impedance of the amplifier by:
subtracting the sum of the mutual-inductance coefficients of the output inductor from the sum of the self-inductance coefficients of the output inductor, producing an output numerator;
dividing the output numerator by the sum of respective capacitor capacitances of the plurality of amplification branches of the amplifier, producing an output quotient; and
calculating the square root of the output quotient.

14. The computer-readable media of claim 11 wherein the first delay line comprises:
first elementary inductors associated with the self-inductance coefficients of the portions of the input inductor, connected in series; and first delay line capacitors associated with the transistor capacitances of the plurality of amplification branches, each first delay line capacitor connected at one end to a corresponding node between respective first delay line inductors and at another end to a first common node.

15. The computer readable media of claim 14 wherein the second delay line comprises:
second elementary inductors associated with the self-inductance coefficients of the output inductor, connected in series; and
second delay line capacitors associated with the capacitor capacitances of the plurality of amplification branches, each second delay line capacitor connected at one end to a corresponding node between respective second elementary inductors and at another end to a second common node.

16. The computer-readable media of claim 11 wherein the instructions further cause the processor to calculate the first exponent by calculating a product of a number of amplification branches of the amplifier, negative one and the input attenuation.

17. The computer-readable media of claim 16 wherein the instructions further cause the processor to calculate the second exponent by calculating a product of the number of amplification branches of the amplifier, negative one and the output attenuation.

18. A wide-band amplifier, comprising:
an input inductor electrically coupled between an input node and a reference node and having a plurality of intermediate input inductor nodes;
an output inductor electrically coupled between an output node and the reference node and having a plurality of intermediate output inductor nodes; and
a plurality of amplification stages, each of the plurality of amplification stages electrically coupled between a respective intermediate input inductor node and a respective intermediate output inductor node, wherein the plurality of amplification stages are electrically coupled to respective intermediate input inductor nodes in a first order and to respective intermediate output inductor nodes in a second order.

19. The wide-band amplifier of claim 18 wherein the second order is an inverse of the first order.

20. The amplifier of claim 1 further comprising:
a first resistor; and
a second resistor, wherein the second end terminal of the input inductor is connected to the first terminal of the power source via the first resistor and the first end terminal of the output inductor is connected to the first terminal of the power source via the second resistor.

* * * * *